(12) United States Patent
Feger et al.

(10) Patent No.: US 10,108,762 B2
(45) Date of Patent: Oct. 23, 2018

(54) TUNABLE MINIATURIZED PHYSICAL SUBSURFACE MODEL FOR SIMULATION AND INVERSION

(71) Applicant: International Business Machines Corporation, Armonk, NY (US)

(72) Inventors: Claudius Feger, Rio de Janeiro (BR); Lior Horesh, North Salem, NY (US); Ulisses T. Mello, Blauvelt, NY (US); Maria J. B. Moura, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 1051 days.

(21) Appl. No.: 14/505,623

(22) Filed: Oct. 3, 2014

(65) Prior Publication Data
US 2016/0098498 A1 Apr. 7, 2016

(51) Int. Cl.
*G06G 7/48* (2006.01)
*G06F 17/50* (2006.01)
*G01V 99/00* (2009.01)
*B33Y 50/02* (2015.01)

(52) U.S. Cl.
CPC ........ *G06F 17/5009* (2013.01); *G01V 99/005* (2013.01); *B33Y 50/02* (2014.12)

(58) Field of Classification Search
CPC .......................... G06F 17/5009; G01V 99/005
USPC .......................................................... 703/10
See application file for complete search history.

(56) References Cited

U.S. PATENT DOCUMENTS

| 5,583,825 | A | * | 12/1996 | Carrazzone | ............ | G01V 1/288 367/31 |
| 5,710,726 | A | | 1/1998 | Rowney et al. | | |
| 6,229,312 | B1 | | 5/2001 | Fleury et al. | | |
| 6,393,363 | B1 | * | 5/2002 | Wilt | ........................ | G01V 3/30 324/323 |
| 6,401,042 | B1 | * | 6/2002 | Van Riel | .................. | G01V 1/30 702/17 |
| 7,043,413 | B2 | * | 5/2006 | Ward | ..................... | G01V 11/00 702/5 |

(Continued)

FOREIGN PATENT DOCUMENTS

| DE | 112015003775 T5 | 5/2017 |
| GB | 2482097 B | 9/2013 |

(Continued)

OTHER PUBLICATIONS

Alrifaiy et al. ("Polymer-Based Microfluidic Devices for Pharmacy, Biology and Tissue Engineering", Polymers 2012, 4, 1349-1398).*

(Continued)

*Primary Examiner* — Omar Fernandez Rivas
*Assistant Examiner* — Iftekhar Khan
(74) *Attorney, Agent, or Firm* — Stephen R. Yoder

(57) ABSTRACT

Conventional computational simulation and inversion of subsurface flow is expensive, which is wasteful in terms of time and energy consumption. The present invention discloses a process for implementation of mathematical techniques such as forward simulation, sensitivity analysis, and inversion to physical microstructure models for subsurface fluid simulation. This process not only offers accurate and reliable results, but also is cost effective.

18 Claims, 3 Drawing Sheets

(56) References Cited

U.S. PATENT DOCUMENTS

| | | | | |
|---|---|---|---|---|
| 7,525,873 | B1* | 4/2009 | Bush | G01V 1/28 367/37 |
| 7,725,266 | B2* | 5/2010 | Sirgue | G01V 1/28 166/254.1 |
| 8,504,335 | B2 | 8/2013 | Furman et al. | |
| 8,725,481 | B2* | 5/2014 | Usadi | E21B 43/12 702/6 |
| 9,260,947 | B2* | 2/2016 | Lu | G01V 99/00 |
| 2004/0186667 | A1* | 9/2004 | Lee | G01V 1/30 702/14 |
| 2005/0256643 | A1* | 11/2005 | Boitnott | G01V 11/00 702/6 |
| 2008/0015782 | A1* | 1/2008 | Saltzer | G01V 1/306 702/12 |
| 2008/0195358 | A1* | 8/2008 | El Ouair | G01V 1/30 703/2 |
| 2008/0236652 | A1* | 10/2008 | Defries | F24J 2/48 136/248 |
| 2008/0255816 | A1* | 10/2008 | Neville | E21B 49/00 703/10 |
| 2009/0150124 | A1* | 6/2009 | Wilt | G01V 3/38 703/1 |
| 2009/0204327 | A1* | 8/2009 | Lu | G01V 3/083 702/7 |
| 2010/0185422 | A1* | 7/2010 | Hoversten | G01V 11/00 703/2 |
| 2010/0208554 | A1* | 8/2010 | Chiu | G01V 1/362 367/153 |
| 2011/0000678 | A1* | 1/2011 | Krebs | G01V 1/282 166/369 |
| 2013/0054157 | A1* | 2/2013 | Lasseux | G01N 15/0826 702/47 |
| 2013/0120379 | A1* | 5/2013 | Adair | G06T 19/00 345/420 |
| 2013/0275106 | A1* | 10/2013 | Li | G01V 11/00 703/10 |
| 2013/0282286 | A1* | 10/2013 | Thorne | G01V 99/005 702/7 |
| 2014/0257780 | A1* | 9/2014 | Jing | G01V 99/005 703/6 |
| 2015/0212232 | A1* | 7/2015 | Perkins | E21B 49/087 73/152.18 |
| 2015/0378053 | A1* | 12/2015 | Abadpour | G01V 99/005 702/2 |

FOREIGN PATENT DOCUMENTS

| | | |
|---|---|---|
| GB | 2546180 A | 7/2017 |
| JP | 20170516465 A | 10/2017 |
| WO | 2013012470 A1 | 1/2013 |
| WO | 2016051292 A1 | 4/2016 |

OTHER PUBLICATIONS

Song et al. ("System-level simulation of liquid filling in microfluidic chips", American Institute of Physics, 2011, pp. 1-16 ).*
Gerard J. M. Bruin ("Recent developments in electrokinetically driven analysis on microfabricated devices", Electrophoresis2000, 21, 3931-3951 ).*
R. Gerhard Pratt ("Seismic waveform inversion in the frequency domain, Part 1: Theory and verification in a physical scale model", Geophysics, vol. 64, NQ 3 (May-Jun. 199'J); p. 888-901).*
Al-Saadoon et al., "Building a Simulation Grid for Large Scale Reservoir Simulation", EAGE Annual Conference & Exhibition incorporating SPE Europec, London, United Kingdom, Jun. 10-13, 2013, pp. 1-12, Copyright 2013, Society of Petroleum Engineers.
El-Khamra et al., "Modelling Data-Driven CO2 Sequestration Using Distributed HPC Cyberinfrastructure", TeraGrid'10, Aug. 2-5, 2010, Pittsburgh, PA, USA, Copyright 2010 ACM.
Liu et al., "Geological Characterization of Naturally Fractured Reservoirs Using Multiple Point Geostatistics", SPE/DOE Improved Oil Recovery Symposium, Tulsa, Oklahoma, Apr. 13-17, 2002, pp. 1-12, Copyright 2002, Society of Petroleum Engineers Inc.
Parashar et al., "Experiments with HPC-as-a-Cloud: On-Demand ENK-Based Oil Reservoir History Matching on the Blue Gene / P", A Demonstration at the Super Computing Conference, Nov. 2010.
Pinkston, Daniel Patrick, From outcrop to functional reservoir model : using outcrop data to model the tidally dominated esdolomada sandstone, NE Spain, Master's thesis, University of Texas at Austin, May 2012, © 2008 Texas Digital Library.
Scheidl et al., "Estimation of Debris-Flow Impact Forces Using a Small Scale Modelling Approach", 12th Congress Interpraevent 2012, Grenoble / France—Extended Abstracts, pp. 342-343.
Vaucher et al., "Validating a Physical Model with Real Data—Part 1: Verifying Wind Tunnel Flow Features in Equivalent Real-Sized Data", International Test and Evaluation Association, Modeling and Simulation Conference, Dec. 11-14, 2006, Las Cruces, NM, pp. 1-16.
Yildiz et al., "Experimental Study on the Productivity Complex Well Configurations", SPE International Conference on Horizontal Well Technology, Nov. 1-4, 1998, Calgary, Alberta, Canada, Copyright 1998, Society of Petroleum Engineers, Inc.
Barberoglou et al., "Electrowetting Properties of Micro/ Nanostructured Black Silicon", Langmuir Article, Published on Web Jul. 1, 2010, DOI: 10.1021/la101138u, pp. 13007-13014, © 2010 American Chemical Society.
Feger et al., "Tunable Miniaturized Physical Subsurface Model for Simulation and Inversion", National PCT Application No. IB2015/ 056665, Filed on Sep. 2, 2015, 17 pages.
Patent Cooperation Treaty, PCT, Notification of Transmittal of the International Search Report and the Written Opinion of the International Searching Authority, or the Declaration, Applicant's File Reference YOR140176, International application No. PCT/IB2015/ 056665, Filing date: Sep. 2, 2015, dated Dec. 25, 2015.

* cited by examiner

TUNABLE MINIATURIZED PHYSICAL SUBSURFACE MODEL FOR SIMULATION AND INVERSION

FIELD OF THE INVENTION

The present invention relates generally to the field of simulation, and more particularly to simulation and inversion of subsurface flow.

BACKGROUND OF THE INVENTION

Geophysical simulation and inversion of subsurface flow are common in the oil and gas field. Simulation is a process of attempting to predict the behavior of a system with predefined characteristics and under certain conditions. For computational simulation the process requires the definition of model parameters, defining physical relations and development of computational algorithmic framework. Once these are established, the simulation itself is time consuming, as it is performed using state of the art von-Neumann computational architecture. Geophysical inversion is a process used to find a distribution of a physical property that causes a set of physical measurements recorded in a field survey. For inversion, the goal is to infer the subsurface model parameters, or substructure properties, given measurement data. This inference process involves the solution of a large-scale non-linear optimization problem in which the simulation problem is solved repeatedly (both for function evaluation as well as for derivation of the gradients).

SUMMARY

According to an aspect of the present invention, there is a method for simulation and inversion on a physical subsurface model, that performs the following steps (not necessarily in the following order): (i) performing a forward simulation on a first physical subsurface model to determine a fluid state; (ii) conducting a sensitivity analysis on the first physical subsurface model; and (iii) performing an inversion on the first physical subsurface model to determine a substructure property of the first physical subsurface model.

DETAILED DESCRIPTION

Figure 1:
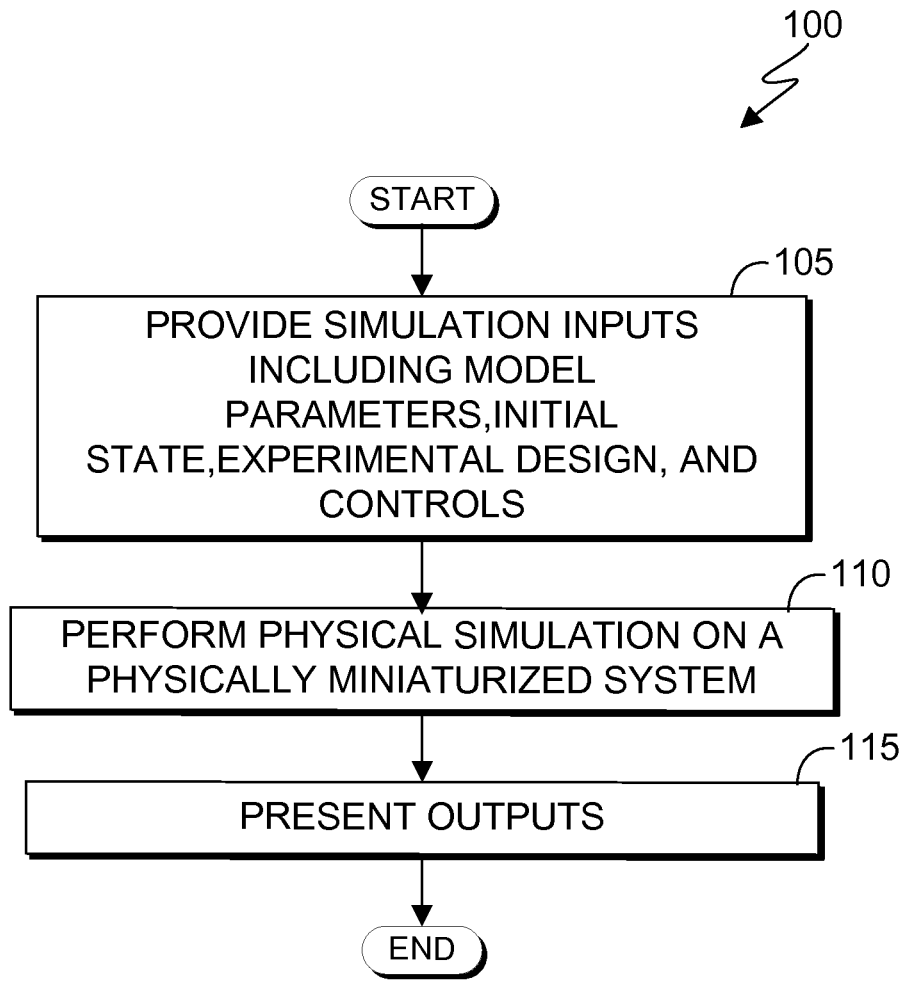
FIG. 1 is a flow chart view of a first embodiment of a method according to the present invention.

Computational simulation and inversion of subsurface flow is computationally expensive, as simulation and to a greater level inversion of realistic models is typically done using high performance computing systems, which are wasteful in terms of time and energy consumption. In addition, these mathematical models for simulation and inversion are mis-specified and therefore, they introduce errors into the desired predictions and inferences. As such, alternatives to those conventional computational simulation and inversion are desired, which not only are time saving, but are accurate and reliable.

A process for applying mathematic theories such as forward simulation, sensitivity analysis, and inversion to physical microstructure models is provided for subsurface fluid simulation. This process replaces the need for conventional, costly computational simulation and inversion studies.

As described above, although mathematical models for simulation and inversion have been developed extensively in the past decades, the computationally expensive simulation and inversion processes often require the solution of large-scale complex systems of partial differential equations. Moreover, for inversion, multiple simulations are required, which increase significantly the overall computational cost.

Recently, applications of microfluidics-based chips in the oil and gas industry have attracted much interest. Microfluidics-based chips can be considered as miniaturized laboratories, also referred to as a lab on a chip, which are: (i) fast; (ii) inexpensive; (iii) easy to use; and/or (iv) portable, and can be made of materials including: (i) polymers/plastics (hard and flexible); (ii) ceramics; (iii) metals; (iv) glass; (v) paper; and/or (vi) silicon. The channel dimension on those chips ranges from micro- to nano-meters. Microfluidics have potential to perform entire oil and gas experiments on a single credit card-sized chip, for example: (i) investigation of interactions between surfaces, oil, brine, gas and other media at the microscale; and/or (ii) controlling environments including geometries, wettability, viscosities, temperature, pressure, external forces, and flushing fluids and gas.

Recent developments on reservoir on a chip introduce a fixed (non-tunable) physical miniaturized substrate that can be used to study fluid-surface interaction (e.g., chips filled with heavy oil/Toluene mix, Canadian oil sand pattern, and fixed wettability patterns). For example, two dimensional microfluidic chips with fixed channel structure are made in glass, Teflon, and silicon, and are designed from images of actual reservoir rocks as well. These chips mimic the structure of a porous rock medium, and allow for the injection of fluids, and observation of the interactions. These chips are designed to mimic specific rock sample and therefore have a fixed structure and fixed properties (e.g., porosity, permeability, seal factor, and so on).

Microfluidic devices with tunable microtopographies can be developed to physically trap small fluid volumes within microchannels, "Doughnut"-shaped membranes are pressurized in a series of steps to trap various dyes, after the microchannel is sequentially filled with each dye.

Another development is programmable microfluidics in which flexible microfluidic chips and high-level software libraries enable large, complex biological experiments to be easily executed on a single platform. Such microfluidic devices comprise fluidic hardware primitives (e.g., valves, multiplexers, mixers, and latches), fluidic instruction set architecture (ISA) that controls the hardware (e.g., primitives for I/O, storage, transport, mixing), and protocol description language that are readable code with high level mixing ops.

Some embodiments of the present invention provide a method of using a tunable miniaturized physical reservoir model (adaptive reservoir on a chip) to perform reservoir simulations and/or inversion of geological subsurface flow to substitute the expensive computational burden of simulation and inversion on von-Neumann-like computational architecture. The miniaturized model comprises of components that can adjust their properties and structure in a prescribable fashion according to specific reservoir characterization parameters, for example, through application of: (i) optical signal; (ii) thermal input; (iii) electromagnetic wave; (iv) mechanical stress; etc. Through fluid flow analysis, the state, or phase, of the fluid flow at every instance may be observed to obtain a simulation output.

As pointed out, the physical miniaturized model can be adapted to correspond to any desired structures and properties. For example, the physical model can be made of materials including: (i) polymers/plastics (hard and flexible); (ii) ceramics; (iii) metals; (iv) glass; (v) paper; and (vi) silicon. Actual porous rock samples can also be used as the physical models—the channel structure is fixed, but the surface properties can be changeable. Visualization with a microscope can be achieved by combing a glass lid with the rock chip.

In some embodiments of the present invention, the model channels can be patterned in substrates using standard modern or micro-lithographic techniques by, for example, applying a resist (e.g., by means of such as lamination, spin, or spray apply) to a substrate; exposing to an energy source through a patterned mask; removing the soluble part of the resist; and etching the pattern into the substrate. Depending on the dimensions to be desired an e-beam lithographic resist can be used. The methods used herein are the same as the ones that are being used to fabricate MEMS (micro-electro-mechanical system) or NEMS (nano-electro-mechanical system) devices. In order to make a microfluidics device the channels thus created have to be closed with another layer, either with a matching etched channel substrate, or a flat polymer or other solid material (e.g., a glass slide).

Reference will now be made in detail to the embodiments of the present invention, examples of which are illustrated in the accompanying figures. Wherever possible, the same reference numbers will be used throughout the figures to refer to the same or like parts.

Referring now to FIG. 1, illustrated is a flowchart depicting operational steps for process 100 for simulation on a physically miniaturized system, in accordance with an embodiment of the present invention. The illustrated process is referred to herein as the "forward simulation" process. The state of the fluid(s) is determined by this forward simulation process.

In step 105, inputs including physical model parameters, initial physical model state, experimental design, and controls are supplied for the physical simulation. Simulation is the process of attempting to predict the behavior of a system (in this case, a physical system) of predefined characteristics and under certain conditions. In this exemplary embodiment, the predefined characteristics of the physical model are denoted as model parameters including, for example, material properties. The conditions are denoted as the initial state and controls, for example, a given initial state of the system, and knowledge of forcing terms acting upon the system. The response of the system to such conditions is measured using certain devices (e.g., volt meters, flow meters, and pressure sensors) at certain locations and/or times that are referred to as experimental design.

The model parameters further include surface properties that can be changed through etching or coating with another material. These can change wettability, permeability, and porosity of the chip. In some embodiments of the present invention, some of such changes can be reversible. In some embodiments of the present invention, some of such changes are not reversible. Alternatively, the wettability can also be changed by UV (ultraviolet) lighting exposure. Alternatively, the wettability can be changed by electrowetting.

In some embodiments of the present invention, the surface properties can be modified using silanes with various functional groups (typically used as adhesion promoters) and other surface chemical reactions. Patterns can be created in the surfaces by lithographic processes by, e.g., removing previously applied adhesion promoters. Some of these surface modifications can be removed in place, i.e., after device fabrication, by application of highly aggressive chemicals such as aqua regia.

The initial state of the model may further include: (i) pressure; (ii) saturation; and/or (iii) temperature. The controls may further include: (i) fluid injection rates; (ii) applied force; (iii) magnetic field strength; (iv) electric field strength; (v) voltage difference; and/or (vi) bottom hole pressure. The experimental design may further include: (i) temperature sensor configuration.

In step 110, a physical simulation is performed using the proposed physical model upon providing the inputs including model parameters, initial state, experimental design, and controls. In this example, the size, shape, and pattern of channel are changeable during the operation of the physical simulation, providing a flexible and cost-effective approach for simulation. Such changes can be made in several ways. The specific solution may or may not depend on the fluids that are being used. For example, for aqueous solutions, black silicon can be used to block or allow liquid flow. Black silicon only becomes wettable when voltage is applied to it, therefore allowing liquids to flow through paths that were previously closed. This process can be used only once, i.e., it is not reversible. Alternatively, other one-time procedures include using membranes which can be penetrated such as dissolvable membranes used for drug delivery.

Alternatively, multiple use technologies are typically based on using valves such as manually activated pin valve, and elastomeric normally closed microfluidic valves. Another example of valve is that a soft polymer (typically silicone polymer) is pressed into or pulled out of a microchannel; since silicones have poor wettability the polymer does not have to close the microchannel hermetically and partial closure will suffice.

Alternatively, other approaches to tune the size, shape, and pattern of channel may include: (i) packing beads; (ii) magnets controlled by a magnetic field; (iii) beads manipulated by electric voltage; and/or (iv) flexible polymer with moving frame/keys.

In step 115, the outputs of physical simulation are presented. The simulation outputs can be described either as the entire state of the fluid (i.e., direct state estimation) or as sample state estimation. In this example, the outcomes are interactions between surfaces, oil, gas, and other media at the microscale. Some embodiments of the present invention provide: (i) interactions between fluids and surfaces; (ii) flow field; (iii) pressure distribution; (iv) viscosity change; (v) temperature distribution; and/or (vi) saturation of gas in liquids (oil, water, brine, and others). By tuning either one of the model parameters, initial state, experimental design, and controls or any combination thereof, a whole different set of simulation outcomes are obtained.

Figure 2:
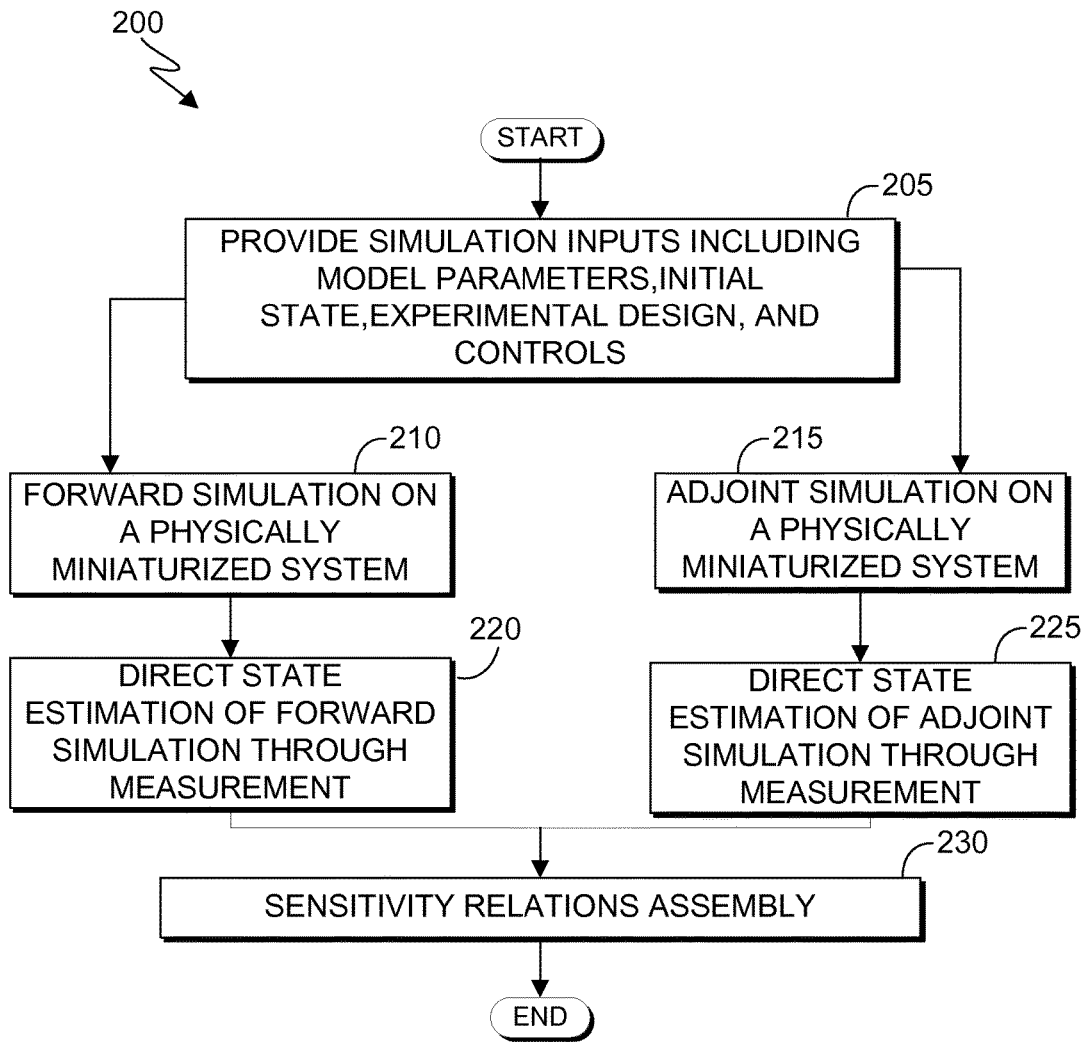
FIG. 2 is a flow chart view of a second embodiment of a method according to the present invention.

Referring now to FIG. 2, illustrated is a flowchart depicting operational steps for process 200 for sensitivity analysis on a physically miniaturized system, in accordance with an embodiment of the present invention.

Sensitivity analysis identifies sensitivity-based relationships between a change in a model parameter (or any other free variable) with a corresponding change in the state or measurement of the state, for example, to determine the sensitivities of the observables with respect to a change in the model parameters. The stronger the sensitivity-based relationship (as determined by sensitivity analysis), the greater the correlation between the input and output parameters. The sensitivity relationship provides spatial granularity of such correlations, and allows one to determine the expected quality (e.g., resolution, distinguishability, and reliability) of the resolved model, whether inferred or inverted.

In this example, the process presented in steps 205, 210, and 220 in FIG. 2 is illustrated by the process shown in FIG. 1. Steps 205, 210, and 220 are herein referred to as "forward simulation," as distinguished from "adjoint simulation." To analyze sensitivity, additional steps of so called "adjoint simulation," in addition to the forward simulation, is required. For the adjoint simulation, the state of the fluid associated with a reciprocal problem setup (for example, reversing roles of sources and receivers in step 205, starting with final boundary conditions in step 205, and working the simulation process backwards in step 215), is being estimated, herein referred to as direct state estimation of adjoint simulation in step 225.

It should be noted that, in this example, both the forward simulation and the adjoint simulation are performed on the same physical miniaturized model. In step 230, the aforementioned sensitivity-based relationships are derived from the two state estimation fields: (i) direct state estimation of forward simulation; and (ii) direct state estimation of adjoint simulation. Examples of sensitivity-based relationships include, but are not limited to: (i) flow field versus surface wettability; (ii) gas saturation versus porosity; (iii) temperature versus viscosity; and/or (iv) pressure versus porosity.

Such sensitivity quantities are important for estimation of the admissible information content of the observables, and guide the non-linear optimization process of adjusting the model properties and structure. Once sensitivities are obtained, gradient-based optimization is performed, and the model properties and structure are adjusted accordingly.

Figure 3:
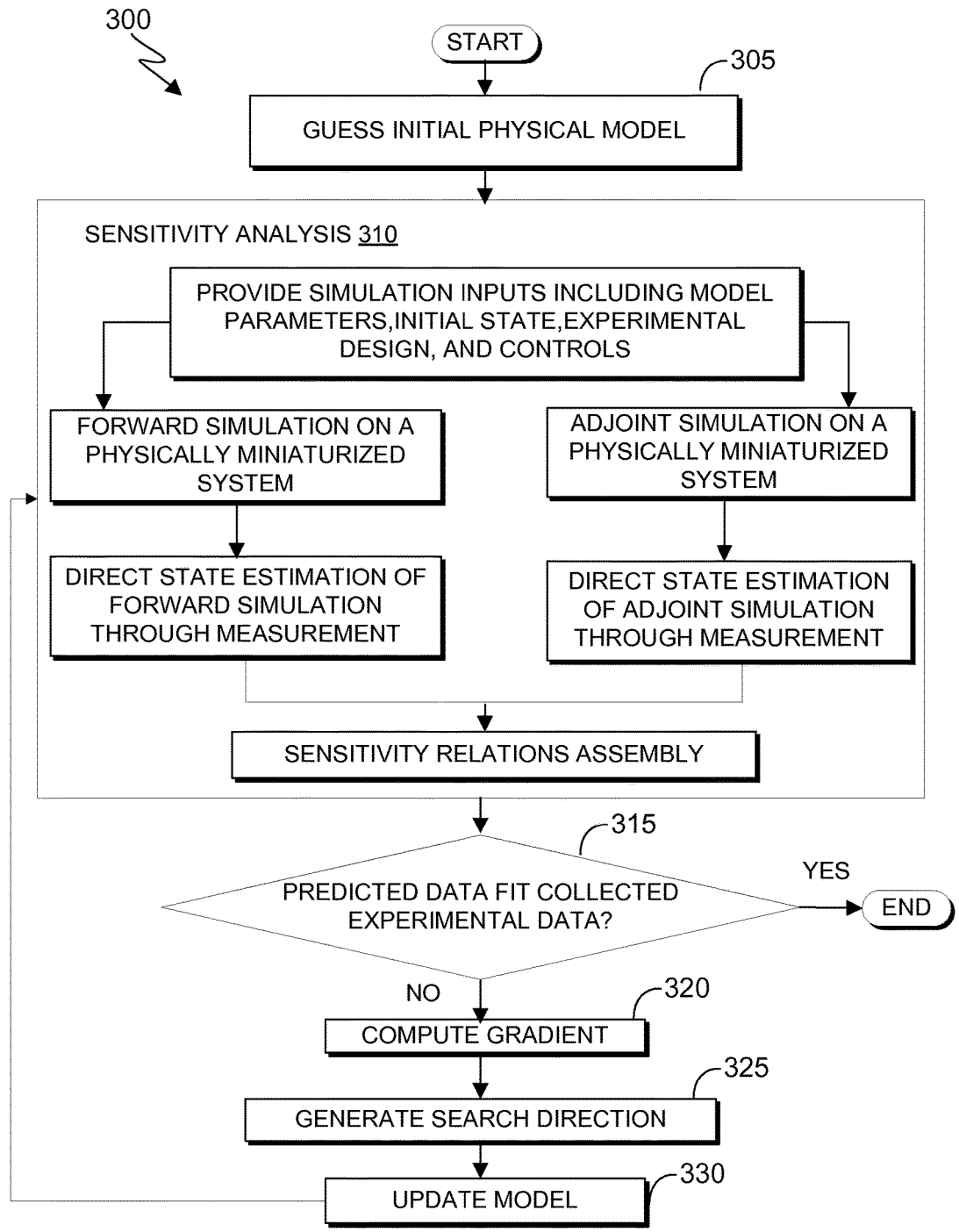
FIG. 3 is a flow chart view of a third embodiment of a method according to the present invention.

Referring now to FIG. 3, illustrated is a flowchart depicting the operational steps of process 300 for inversion on a physically miniaturized system, in accordance with an embodiment of the present invention.

Inversion is a procedure that has an objective that is opposite to that of forward simulation, which estimates possible models when prior collected data are available. The objective of inversion is to adjust the miniaturized model properties and structure such that it would provide similar observable outputs as the data that are recorded on the actual settings.

The inversion process begins with an initial guess of the model configuration, referred to as initial guess as in step 305. The first estimate of the model is based upon a prior understanding of the situation in which the model is applied. For example, an initial guess of permeability and porosity of the model can be given based on the prior information.

In step 310, an identical process to the one described in FIG. 2 is performed. A forward simulation on that initial model is performed to predict the resulting measurement data set. The resulting measurement data set contains the predicted data set. The actual field data set, herein referred to as the collected experimental data set is compared to the predicted data set generated for the initial or updated model, as in step 315. The criteria applied to compare the two data sets, the collected experimental data set and the predicted data set, may be specified by a user, or determined according to the situation in which the physical model is applied, or by a corporate policy. In this example, the criterion involves specifying standard deviations for the collected experimental model.

If the two data sets are sufficiently similar or fitting ("YES" branch is selected in decision step 315), the process proceeds to end where a desired physical miniaturized model is achieved. If the two data sets are not sufficiently similar ("NO" branch is selected in decision step 315), a gradient of an objective function is computed in step 320 using the sensitivity relations obtained in step 310. In this example, the objective function measures the discrepancy between the two data sets. Alternatively, additional preferences or a-priori information in the form of regularization or constraints are incorporated into the objective function.

In step 325, a search direction for a new model is derived based on the computed gradient. Consequently, the new model with modified properties and structure is generated in step 330 based on the search direction. This updated, new model may have tuned surface properties (e.g., wettability and porosity), channel structure, and/or channel patterns. Processing returns to step 310, where sensitivity analysis is performed until sufficient fit or other prescribed criteria associated with the mode search is met, that is, the process may be iterative when the two data sets are not sufficiently similar, as determined in decision step 315.

Some embodiments of the present invention may include one, or more, of the following features, characteristics and/or advantages: (a) accuracy and reliability—(i) performing an actual physical experiment rather than attempting to predict its outcomes using an approximated model may account more accurately for the underlying physical behavior of such complex systems; and/or (ii) capturing traits and responses that may not be captured by current modeling formulation; (b) computational saving—attempting to predict and/or infer the behavior of subsurface interactions with fluids using mathematical models on von-Newmann architectures is a cumbersome process, involving a large computational effort, instead, using the very same natural physical processes for performing such predictions and inferences requires almost no computational effort; (c) channel structure can be two dimensional or three dimensional; (d) the physical model is multi-scale that can work for macro, micro, and nanofluidics; (e) channel patterns can be changed (e.g., grains, movable construction, pores, and/or pore networks); (f) channel properties can be changed, for example, through coating, etching, and electrowetting; (g) able to support variable pressure and temperature depending on design; (h) although the physical model is a table-top experiment, it could be multiple chips connected, or a long/wide chip such that it has a variable size to mimic the inhomogeneity of a reservoir; (i) such tunable models can be used for additional purposes, such as uncertainty quantification, experimental design, model mis-specification assessment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A method for updating a physical subsurface model on a microfluidics-based chip, comprising:
    performing a forward simulation on a first physical subsurface model to determine a fluid state, the first physical subsurface model being a mechanical model including an adaptive reservoir on the microfluidics-based chip;
    conducting a sensitivity analysis on the first physical subsurface model;
    determining a substructure property of the first physical subsurface model by:
    predicting a first dataset by applying a first physical model parameter set to the first physical subsurface model;
    performing a set of experiments in an actual environment for which the first physical subsurface model represents to generate a second dataset;
    comparing the predicted first dataset with the generated second dataset;
    computing a gradient of an objective function based, at least in part, on the sensitivity analysis; and
    generating a search direction for a second physical subsurface model based, at least in part, on the computed gradient; and
    updating the first physical subsurface model based on the search direction to obtain the second physical subsurface model, the updating including modifying a surface property and a channel structure of the adaptive reservoir of the first physical subsurface model.

2. The method of claim 1, wherein the first physical subsurface model is fabricated using at least one of: (i) a standard lithographic technique; (ii) a micro-lithographic technique; and (iii) an e-beam lithographic technique.

3. The method of claim 1, wherein the first physical subsurface model is multiscaled for applications in: macro-fluidics, microfluidics, and/or nanofluidics.

4. The method of claim 1, wherein the first physical subsurface model is programmable.

5. The method of claim 1, wherein the first physical subsurface model includes a plurality of miniaturized structures.

6. The method of claim 1, wherein the first physical subsurface model is made of at least one of the following materials: (i) polymers/plastics (hard or flexible); (ii) ceramics; (iii) metals; (iv) glass; (v) paper; and (vi) silicon.

7. The method of claim 1, wherein: the first physical subsurface model includes a tuning mechanism for tuning at least one of: a channel size, a channel shape, and a channel pattern; and the tuning mechanism is one of: (i) an optical signal; (ii) a thermal input; (iii) an electric field; (iv) a magnetic field; (v) an electromagnetic wave; (vi) a membrane; (vii) a valve; (viii) a flexible polymer with moving frame; and (ix) a mechanical stress.

8. The method of claim 1, wherein:
    a surface property of the first physical subsurface model is one of: (i) wettability; (ii) permeability; (iii) seal factor; and (iv) porosity; and
    the surface property is tunable by one of (i) etching; (ii) coating; (iii) ultraviolet lighting; (iv) eletrowetting; (v) silanes with various functional groups; and (vi) surface chemical reactions.

9. The method of claim 1, wherein the step of performing a forward simulation on the first physical subsurface model includes:
    supplying a set of inputs for the simulation; and
    presenting a set of outputs for the simulation; and
    further wherein:
    the set of inputs includes: (i) a physical model parameter; (ii) an initial state; (iii) an experimental design; and/or (iv) a control; and
    the set of outputs includes at least one of the following: (i) direct state estimation; and (ii) sample state estimation.

10. The method of claim 9, wherein the physical model parameter is one of: (i) wettability; (ii) porosity; (iii) seal factor; and (iv) permeability.

11. The method of claim 9, wherein the initial state is represented by: (i) a pressure; (ii) a temperature; and (iii) a saturation.

12. The method of claim 9, wherein the control is directed to one of: (i) a fluid injection rate; (ii) an applied force; (iii) a magnetic field strength; (iv) an electric field strength; and (v) a bottom hole pressure.

13. The method of claim 9, wherein the experimental design is one of: (i) a temperature sensor configuration; (ii) a pressure sensor configuration; (iii) a flow meter location; (iv) a voltage measurement location; and (v) a frequency of measurements.

14. The method of claim 9, wherein the direct state estimation and the sample state estimation are one of: (i) a pressure distribution; (ii) a temperature distribution; (iii) a saturation of gas in a fluid; (iv) a viscosity change; and (v) an interaction between a fluid and a surface.

15. The method of claim 1, wherein the step of conducting a sensitivity analysis on the first physical subsurface model includes:
    performing an adjoint simulation on the first physical subsurface model; and
    deriving a sensitivity relation, based, at least in part, on the adjoint simulation, the sensitivity relation being one of: (i) flow field versus surface wettability; (ii) gas saturation versus porosity; (iii) temperature versus viscosity; and (iv) pressure versus porosity.

16. The method of claim 1, wherein comparing the predicted first dataset with the generated second dataset is based on a criterion specified with reference to observable outputs of an actual setting for which the first physical subsurface model represents.

17. The method of claim 1, wherein the objective function is one of: (i) a measurement of discrepancy between the predicted first dataset and the generated second dataset; (ii) a regularization; and (iii) a constraint.

18. The method of claim 1, further comprising:
    creating the channel structure in the first physical subsurface model by applying a first photoresist layer to the channel substrate, exposing the first photoresist layer to an energy source through a patterned photomask, removing soluble photoresist of the first photoresist layer, and etching the channel structure into the channel substrate;
    wherein:
    modifying the channel structure includes applying black silicon to the channel structure to modify fluid flow through the channel structure.

* * * * *